United States Patent [19]
Bohmer

[11] Patent Number: 5,105,156
[45] Date of Patent: Apr. 14, 1992

[54] METHOD AND APPARATUS FOR INDICATING STATE OF CHARGE OF A BATTERY

[75] Inventor: William Bohmer, Succasunna, N.J.

[73] Assignee: Display Matrix Corporation, Randolph, N.J.

[21] Appl. No.: 486,316

[22] Filed: Feb. 28, 1990

[51] Int. Cl.$^5$ ............................................. G01N 27/416
[52] U.S. Cl. .................................. 324/435; 340/784; 359/84
[58] Field of Search ................ 324/435; 340/636, 722, 340/784; 320/48; 350/332 R

[56] References Cited

U.S. PATENT DOCUMENTS

| | | | |
|---|---|---|---|
| 3,774,195 | 11/1973 | Schulthess et al. | 340/753 |
| 4,183,025 | 1/1980 | Kutaragi et al. | 340/722 |
| 4,203,103 | 5/1980 | Osada et al. | 340/636 |
| 4,211,478 | 7/1980 | Huber et al. | 340/636 |
| 4,665,370 | 5/1987 | Holland | 340/636 |
| 4,745,543 | 5/1988 | Michener et al. | 340/754 |
| 4,755,816 | 7/1988 | DeLuca | 340/636 |
| 4,816,768 | 3/1989 | Champlin | 340/636 |

FOREIGN PATENT DOCUMENTS 0047977 2/1989 Japan ................................... 324/435

Primary Examiner—Kenneth A. Wieder
Assistant Examiner—Maura K. Regan
Attorney, Agent, or Firm—John Q. McQuillan

[57] ABSTRACT

The disclosure relates to an analog solid state display device for presenting an analog display of the state of charge and voltage of a battery, typically a rechargeable battery. There is disclosed an apparatus for deriving a signal which is a function of the state of charge of the battery to drive an analog solid state indicating display by such signal. The analog solid state indicating display can comprise an analog liquid crystal display of the voltage and state of charge of a battery to which the display is connected. In addition, there is disclosed a circuit for driving an analog liquid crystal display of the state of charge of the battery with the analog liquid display being disposed within the housing of a tool or appliance which contains the battery. The disclosure also relates to the indication of the state of charge of a battery by an analog liquid crystal display when the battery is under load. The display can comprise an analog bar graph presentation. The disclosure also pertains to an analog liquid crystal display to indicate both the state of charge of a battery and the rate of change of the state of charge of the battery. There is also disclosed a method of indicating the state of charge of a rechargeable battery which includes the steps of amplifying the output of the battery of which the charge is to be indicated while the battery is under load, subjecting the range of amplified outputs extending from a fully discharged condition to a fully charged condition of the battery to a predetermined electrical function, and applying the output which has been subjected to the predetermined electrical function to a display device in which the size, extent, or position of the display portion indicates the charge level and the state of charge of the battery.

30 Claims, 4 Drawing Sheets

FIG. 1
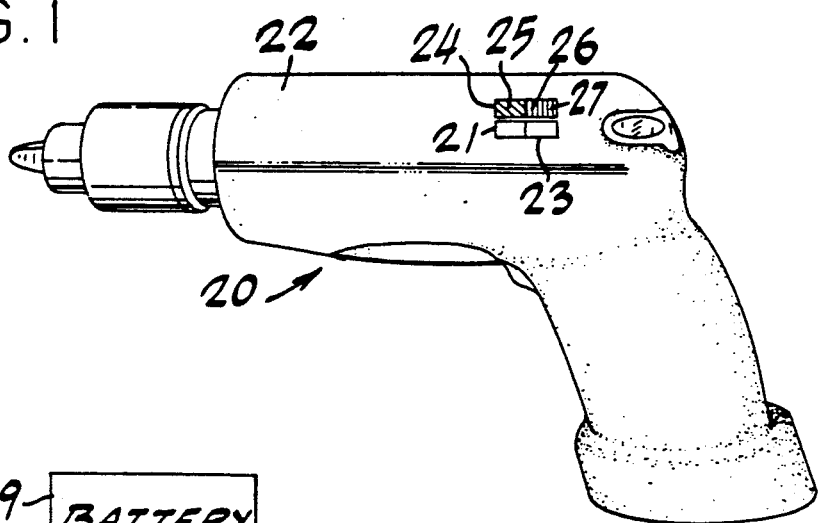
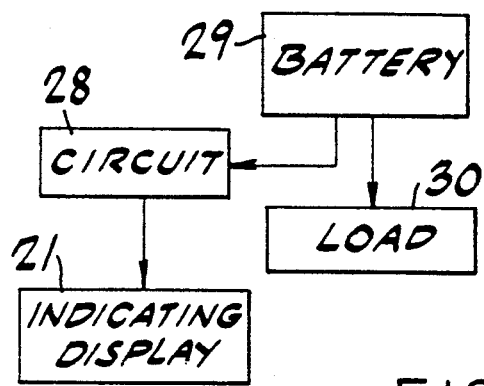
FIG. 2
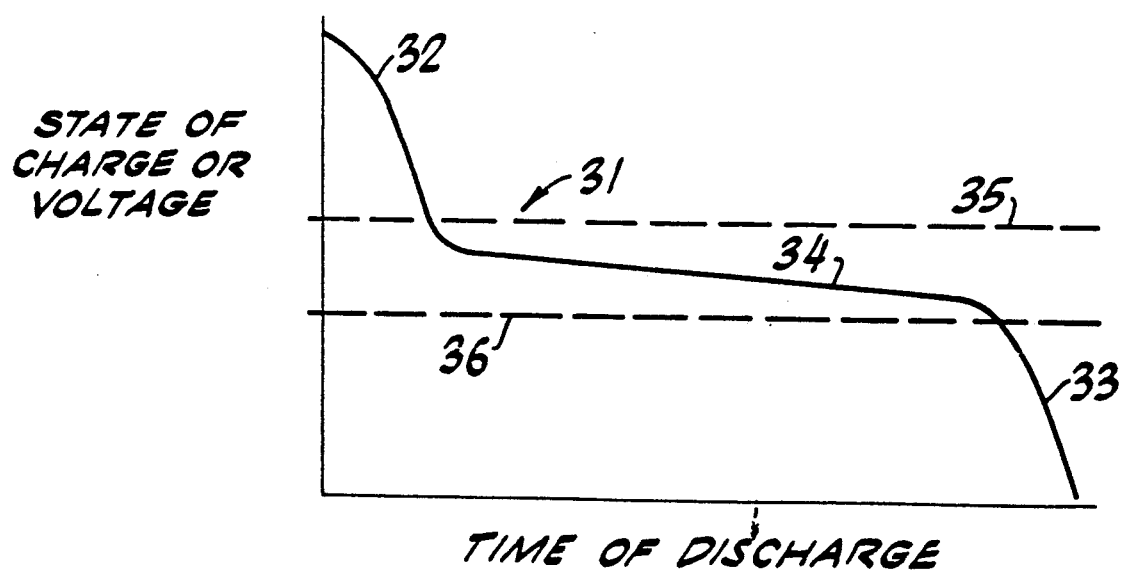
FIG. 3

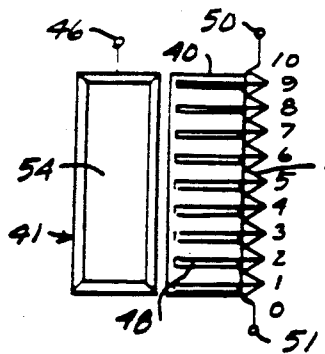 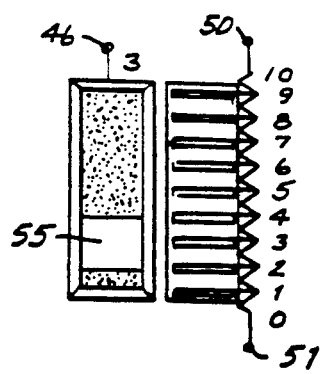 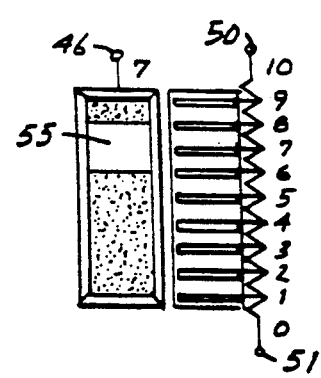
FIG. 7A   FIG. 7B   FIG. 7C
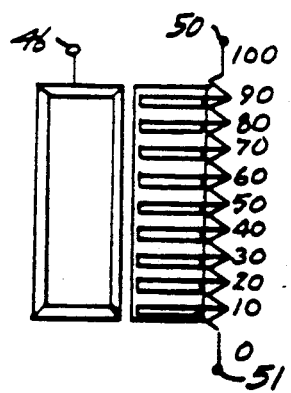 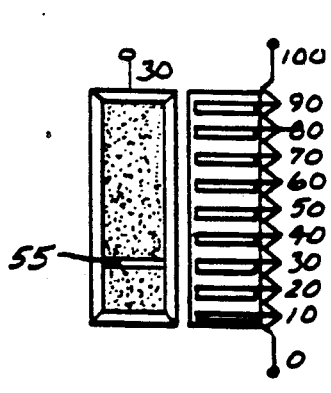 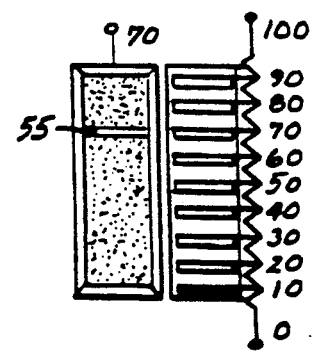
FIG. 8A   FIG. 8B   FIG. 8C
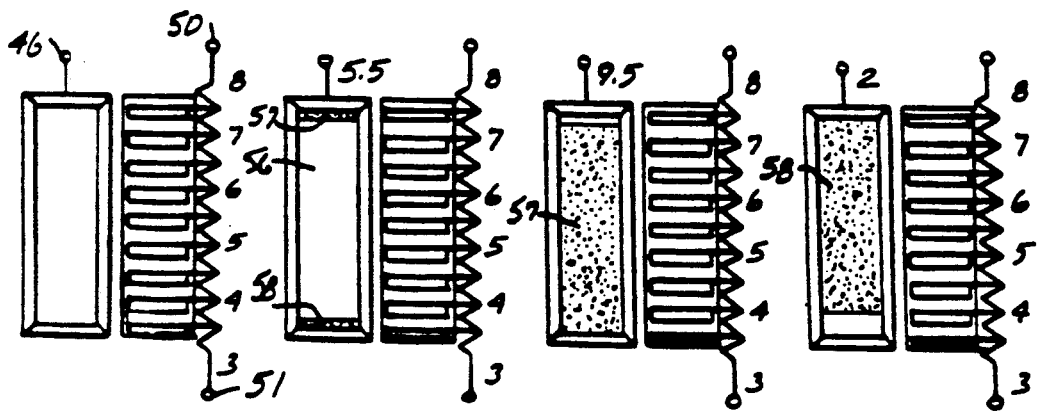
FIG. 9A   FIG. 9B   FIG. 9C   FIG. 9D

METHOD AND APPARATUS FOR INDICATING STATE OF CHARGE OF A BATTERY

BACKGROUND OF THE INVENTION

1. Field of the Invention

The present invention relates to battery charge indicating devices, and particularly to battery charge indicators adaptable for mounting in a housing of a battery powered tool or appliance.

2. Description of the Prior Art

The development of electrical implements, such as portable power tools and small appliances, operated by rechargeable batteries has created a need for charge indicators for the batteries that power such tools and appliances. Such charge indicators must be durable, accurate, inexpensive, and adaptable to be mounted permanently in or on the housings of the battery operated tools and appliances. Another important requirement is that such charge indicators be rugged to withstand the rough handling usually received by tools and small appliances. The measuring circuit of the charge indicators must have low current drain to avoid significant discharge of the battery during measurement of the state of charge of the battery.

Portable battery charge indicating instruments are well-known for checking the state of charge of batteries by connecting a pair of leads of such instruments to the terminals of the batteries to be tested. Such instruments typically employ galvanometers with a circuit for loading the battery while the battery is being tested. These instruments are intended for occasional testing; they are inherently fragile and comparatively expensive.

Also known are digital voltmeters having liquid crystal numeric displays. Their analog to digital converters and complex digital displays make these voltmeters relatively expensive, and the displays must be large enough for the individual numbers to be easily readable.

Battery charge indicators have been permanently installed in storage cells to indicate the charge level as a function of changes in the specific gravity of the electrolyte. Such specific gravity indicators are used primarily with lead acid cells; they are unsuitable for batteries having a gel or solid electrolyte, such as the commonly used rechargeable nickel cadmium batteries.

The applicant's U.S. Pat. No. 3,820,875, which issued on June 28, 1974, discloses a scanner device having a field effect light scattering dielectric (e.g., a liquid crystal material) disposed between a pair of plates. The inner surface of one of the plates carries a resistor of predetermined length and configuration; the inner surface of the other plate carries a substantially nonresistive conductor, facing the resistor. At least one of the one plate and resistor and the other plate and conductor are transparent, so that the dielectric is visible through at least one of the plates.

A first voltage difference applied to the ends of the resistor produces a voltage gradient along the length of the resistor. Selective adjustment of a second, variable, voltage applied to the conductor changes the location on the one plate where the gradient voltage equals the conductor voltage to render the dielectric in that region visually distinguishable from the dielectric in the rest of the space between the plates.

In a three-plate embodiment, a first resistor extends along an edge of a first plate, and a second resistor extends perpendicularly to the first resistor along an adjacent edge of the plate. A series of parallel nonresistive conductor strips extend from each resistor perpendicularly across the opposite faces of the plate to form a grid, with parallel strips in one direction on one face of the plate and parallel strips in a perpendicular direction on the other face of the plate. The first plate is sandwiched between second and third plates, spaced from the respective faces of the first plate and each having a nonresistive conductor on the inner surface facing the respective series of parallel conductor strips. The spaces between the plates are filled with a field effect light scattering dielectric.

A voltage difference impressed on the ends of either resistor and an intermediate voltage applied to the facing conductor produce a-linearly extending visually distinguishable region in the dielectric between them at a location where the potential of a conductor strip equals the voltage applied to the facing conductor. If the dielectric is a liquid crystal, the visually distinguishable region normally is a transparent region. Since the transparent lines formed in the dielectrics on the opposite sides of the one plate are perpendicular to each other, only their intersection is transparent to light passing through both dielectrics. Thus a window is created at the intersection that appears as a visually distinguishable spot. When varying voltages are applied to the conductors on the second and third plates, the spot can be selectively scanned over the display.

U.S. Pat. No. 4,493,531 of BOHMER et al., issued on Jan. 15, 1985, introduces several alternative embodiments of the field sensitive optical display devices described above that can produce various patterns such as a movable dot, intersecting lines, and a pivoting line. Although the display devices of these patents are sturdy and inexpensive, they are not directly usable as battery charge indicators.

SUMMARY OF THE INVENTION

It is therefore an object of the invention to provide an apparatus and method for deriving a signal as a function of the state of charge of a battery and to drive an analog solid state indicating display by such signal.

It is another object of the invention to utilize an analog liquid crystal display to indicate the state of charge of a battery to which the display is connected.

It is a further object of the invention to dispose a circuit for driving an analog liquid crystal display of the state of charge of a battery and the analog liquid display itself within the housing of a device which contains the battery.

It is an additional object of the invention to indicate the state of charge of a battery by an analog liquid crystal display when the battery is under load.

It is also an object of the invention to utilize an analog liquid crystal display to indicate both the state of charge of a battery and the rate of change of the state of charge of the battery.

The method and apparatus of the invention for indicating the state of charge of a rechargeable battery comprise respective steps of and means for amplifying the output of the battery of which the charge is to be indicated while the battery is under load, subjecting the range of amplified outputs extending from a fully discharged condition of the battery to a predetermined electrical function, applying the output subjected to the predetermine electrical function to a liquid crystal display device in which the size, extent, or position of the display portion indicates the charge level or the state of charge of the battery.

The apparatus of the invention further comprises both a display of the state of charge and a display of the rate of change of the state of charge of a battery under load.

BRIEF DESCRIPTION OF THE DRAWINGS

For a complete understanding of the invention, reference should be made to the following detailed description in connection with the accompanying drawings, in which:

FIG. 1 is a perspective view of a battery powered tool having an analog solid state indicating display of the state of battery charge mounted in the tool housing;

FIG. 2 is a simplified block diagram of a battery operated system including the charge indicating device of the invention;

FIG. 3 is a typical discharge curve of a nickel cadmium battery;

FIGS. 7A, B, and C are schematic views of a liquid crystal unit illustrating changes in the display as a function of changes in variable voltage applied to an address plate of a liquid unit with a given potential difference applied to the reference electrode plate;

FIGS. 8A, B, and C are schematic views similar to FIGS. 7A, B, and C illustrating the effect on display resolution of increasing the potential difference applied to the reference electrode plate;

FIGS. 9A, B, C, and D are schematic views similar to FIGS. 7 and 8 illustrating the effect of decreasing the potential difference applied to the reference electrode plate to a small multiple of the actuating voltage of the liquid crystal unit;

DESCRIPTION OF THE PREFERRED EMBODIMENTS

Figure 4:
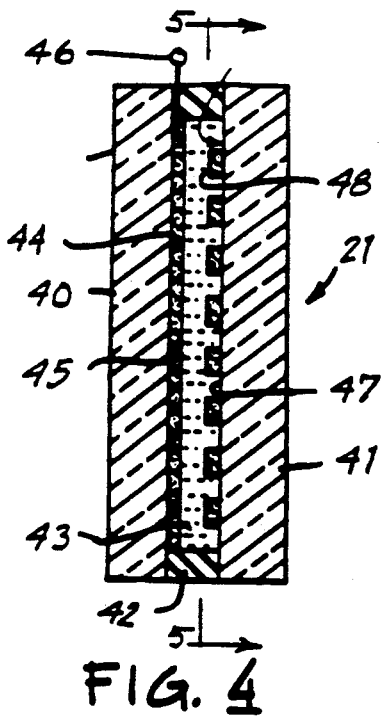
FIG. 4 is a section view of a liquid crystal unit usable as the display element for a battery charge indicating device according to the invention.

In the following description, the same element or a similar element is identified by the same reference numeral in the different figures.

FIG. 1 illustrates a battery powered implement, in this case a power drill or screwdriver 20, having a solid state analog display unit 21 mounted in the top of the housing 22 for showing the state of charge of the battery. The display unit is in the form of an elongated rectangle, and the display consists of a visually distinguishable portion 23 that expands to fill the rectangle when the battery is fully charged and contracts as the battery discharges, so that the display is essentially a "bar graph" of the state of charge. A label 24 next to the display translates the bar graph height into state of charge information. In the illustrated version, the label is divided into three different colored sections, a green section 25 indicating sufficient charge for normal use, a yellow section 26 indicating only a short period of use is still available, and a red section 27 indicating that the battery should be recharged.

As shown in FIG. 2, the indicating display unit 21 is driven by a circuit 28 that is powered by a battery 29 that also supplies power to a load 30, such as the drill in FIG. 1. The construction and operation of preferred embodiments of the indicating display unit 21 and the circuit 28 will be described in detail below.

To design a charge indicating device it is necessary to know the type and voltage range of the batteries it will be used with. Heavy duty portable industrial tools may have are chargeable lead acid battery as a power source; whereas most lighter weight professional and consumer implements are powered by rechargeable nickel cadmium batteries. Each of these battery types has a unique discharge curve (voltage versus time at a constant current load). A lead acid cell has a substantially linear discharge curve up to a final steep dropoff. To accurately indicate the state of charge of a lead acid cell, it is merely necessary to track the linear voltage curve along the entire operating range, or at least to the downturn near the end of discharge, and to present it to the analog display after scaling and amplification through appropriate circuitry. In many cases circuitry is not required and the display can be driven directly from the battery.

By contrast, as shown in FIG. 3, the discharge curve 31 of a nickel battery has two steep portions. The first portion 32 is at the higher, fully charged end, and the other portion 33 is at the lower, nearly discharged end. The operating range of the battery lies in the essentially flat midportion 34 located between upper and lower dashed lines 35 and 36, respectively, which are separated by only a few hundred millivolts. To indicate the state of charge of this type of battery it is necessary to provide a circuit that ignores both the initial and final steep portions of the curve and expands the slope of the so called flat operating section 34 and presents it to the analog display in a linear manner.

The design also depends on the characteristics of the analog display unit which will be driven by the circuit of the device. If, for example, the analog display requires a relatively high voltage for operation and the battery is a low voltage type, the circuit must include a voltage step up or amplifying section. In addition, analog displays typically require a voltage reference, which may desirably be supplied by a voltage regulation circuit.

FIGS. 4 through 9 present the constructional features and operating characteristics of one type of analog display unit based on the scanner devices of the previously discussed BOHMER patent. With reference to FIG. 4, an indicating display unit 21 includes first and second plates 40 and 41 that are maintained in closely spaced apart relation by a peripheral sealing member 42. The space between the plates contains a liquid crystal material 43.

Disposed on the inner surface 44 of the first plate 40 is an address electrode 45 in the form a substantially nonresistive sheet disposed over an area of the plate in which it is desired to vary the optical appearance of the display. In the present example, the address electrode has a rectangular shape for creating an analog bar graph representation. The address plate has a single terminal 46 for connecting the plate to a variable voltage source, which in the case of the present invention would be a source representing the state of charge of a battery.

Figure 5:
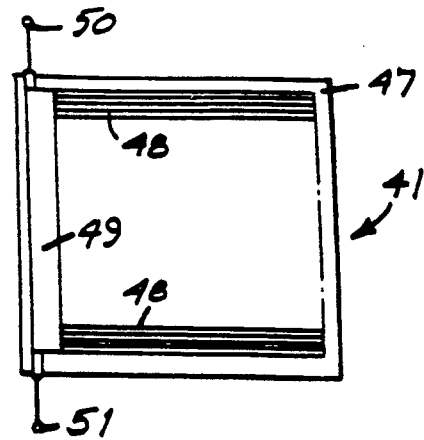
FIG. 5 is face view of a reference electrode plate of the liquid crystal unit, taken along line 55 of FIG. 4.

The inner surface of the second plate 41 carries a series of parallel spaced conductor strips 48. As shown in FIG. 5, these conductor strips 48 are connected at intervals along the length of a resistor 49 that is disposed at an edge of the second plate 41 perpendicular to the conductor strips 48. The number of conductor strips is selected according to the resolution desired for the resulting bar graph display. First and second terminals 50 and 51 at opposite ends of the resistor provide for connecting the resistor across a source of potential difference.

Either one or both of the plates 40 and 41 must be transparent to permit the liquid crystal material to be visible. If the first plate 40 is on the viewing side, the nonresistive address electrode sheet must also be a transparent material, such as a layer of tin oxide. The same is true for the conductor strips 48 if the second plate is on the viewing side, or if the display is to be back lit. If the conductor strips are narrow relative to their spacing, it may desirable that they not be transparent, so that they will provide an inherent voltage scale directly on the display. Alternatively, the plate on the nonviewing side may be reflective, if the dielectric material is to be viewed under ambient light conditions or is itself electroluminescent.

Although the space between the plates is filled with a liquid crystal material in the illustrative example, any field effect light scattering or light emitting dielectric can be used that exhibits a visual change in response to an electrostatic or electromagnetic field. The physical behavior and resulting changes in appearance of these materials under the influence of such fields are well known and need not be discussed in detail here.

Figure 6:
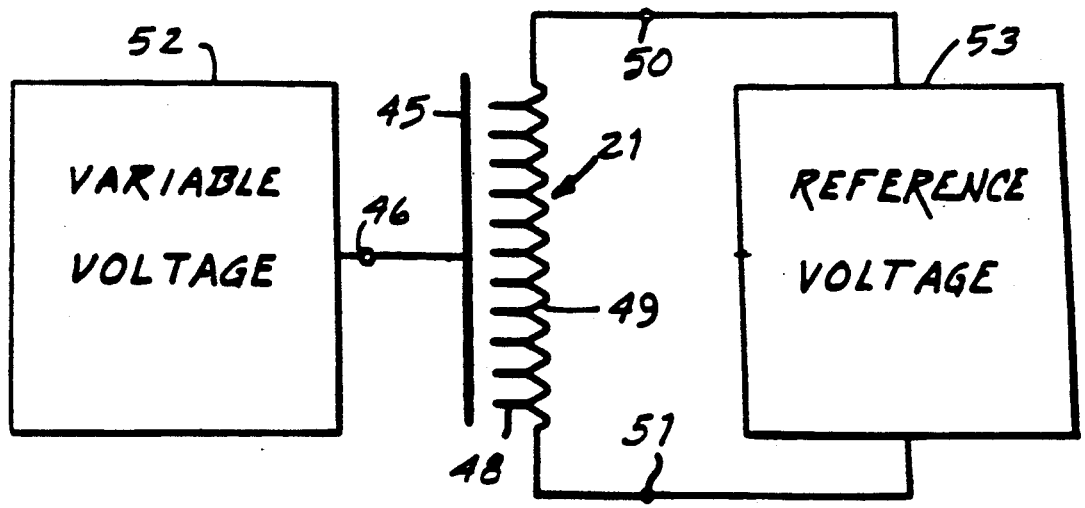
FIG. 6 is a simplified schematic and block diagram illustrating the electrical arrangement of a battery indicating device according to the invention.

FIG. 6 shows in schematic form an analog display unit of the type illustrated by FIGS. 4 and 5, with the terminal 46 of the address electrode 45 connected to a variable voltage source 52 and the first and second terminals 50 and 51 of resistor 49 connected across a reference voltage source 53. The reference source 53 produces a voltage gradient between the ends of resistor 49, so that each of the conductor strips 48 connected at intervals along the length of the resistor has an incrementally different potential from that of the strip on either side. The visual effects resulting from various combinations of variable voltage and reference voltage are discussed in connection with FIGS. 7, 8, and 9, each of which shows several identical indicating display units 21 in schematic form with the first and second plates side by side, instead of superposed, for easier understanding of the relation between the applied voltages and the resulting visual displays.

With reference first to FIG. 7A, a reference potential of 10 voltage units is applied across resistor terminals 50 and 51, with no voltage on address terminal 46. The voltage gradient distributed to the conductor strips 48 is shown along the length of resistor 49. With no potential difference applied across the gap between the address electrode 45 and the conductor strips, the display window 54 of the first plate 40 is clear. In FIG. 7B a potential of three voltage units is applied to address terminal 46, which causes the liquid crystal between the plates 40 and 41 to "turn on" except for the region where the voltage difference between the address plate and individual conductor strips is less than the actuating potential of the liquid crystal. The resulting display shows a clear bar 55 centered at the location of the "three volt" conductor strip, with the rest of the display window dark. In FIG. 7C the potential applied to address terminal 46 is changed to seven voltage units, which causes the bar 55 to move to the seven volt location along the resistor 49. Thus, the location of the bar is changed by simply changing the voltage at terminal 46.

The width of the bar 55 at the equal voltage location along the resistor is a function of the potential difference applied to the resistor terminals 50 and 51, the physical length of the resistor, and the operating voltage of the liquid crystal material, which is typically in the range from zero to two or three volts. In FIGS. 8A-8C the potential difference applied to the resistor terminals is changed from 10 to 100 voltage units. The figures show the resulting visual effect with voltages applied to the address terminal 47 of zero, thirty and seventy units, respectively. With no voltage on the address plate, the display window is clear, as before, but the width of the bar 55 in FIGS. 8B and 8C is reduced by a factor of ten compared with FIGS. 7B and 7C where the potential difference applied to the resistor terminals was only ten voltage units.

FIGS. 9A-D illustrate a novel variation in the potential difference applied to the terminals of resistor 49. The difference is reduced to five volts, but the lowest value is three and the highest value is eight. In FIG. 9A, with no voltage applied to address terminal 46, the display window 54 is clear, as before. When five and a half volts are applied to the address terminal (FIG. 9B), a clear region 56 remains centered in the display window, the vertical extent of the region corresponding to approximately four volts, assuming a liquid crystal operating potential of about two volts. Thus, there are small dark regions 57 and 58 at the top and bottom of the display, respectively. These act like two edge type bar graphs, the dark region 57 moving up from the bottom of the display with increasing voltage applied to the address terminal, and the dark region 58 moving down from the top of the display with decreasing voltage applied to the address terminal. For example, FIG. 9C shows the effect when the variable voltage is increased by four volts to nine and a half volts. Although the highest voltage applied to the resistor 49 is only eight volts, the assumed two volt operating sensitivity of the dielectric material results in the upper edge of the activated portion 57 rising only to the 7.5 volt location on the resistor. Similarly, a reduction in the voltage applied to the address terminal to two volts, as shown in FIG. 9D, causes the lower edge of the activated portion 58 to extend down to the 4 volt location on the resistor. In this example, therefore, it is clear that increasing the variable voltage to ten volts or above will raise the lower bar graph to fill the window, and reducing the variable voltage to one volt or below will similarly lower the upper bar graph to cover the window. Thus, the arrangement illustrated by FIGS. 9A-D provides a theoretical range equal to the potential difference applied to the resistor (e.g., five volts) plus twice the operating voltage of the dielectric material (e.g., twice two volts).

It will be apparent from the above discussion that by tailoring the upper and lower voltages applied to the resistor terminals and by suitably amplifying the operating voltage range, the indicating display unit 21 can be adapted to provide a bar graph presentation of just the middle operating range of a nickel-cadmium battery, with the steep end portions being off scale. A drawback accompanying a low fixed potential difference across the resistor, however, is that resolution is significantly impaired because the visible change in the dielectric material occurs gradually up to a maximum as the voltage difference between the address electrode and the conductor strips increases from the equal voltage location up to the nominal operating voltage of the material.

Figure 10:
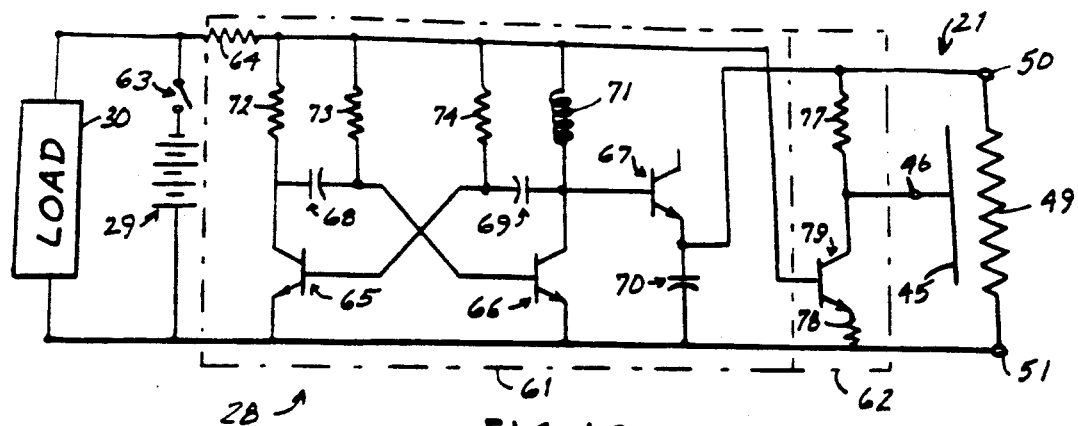
FIG. 10 is an electrical schematic diagram of a battery operated system employing the charge indicator device of the invention.

FIG. 10 shows a schematic diagram of a circuit 28 that is suitable for driving an analog display unit 21 to indicate the state of charge of a battery 29 when the battery is connected to a load 30. In particular, the circuit will produce a bar graph type of display on a unit of the type of FIGS. 4 and 5 installed in a nickel-cadmium battery-powered implement such as the drill of FIG. 1.

The circuit 28 of FIG. 10 has a reference voltage generating section 61 and a battery voltage amplifying section 62. The battery is simultaneously connected to the circuit and the load by closing switch 63, so that the circuit does not drain the battery when the implement is not in operation. This also prevents the indicating display unit from giving a false reading, since it is adjusted to show the state of charge of the battery under load, when the battery voltage is lower than in the no load condition.

When switch 63 is closed, the voltage across resistor 64 is a function of the voltage of the battery when the battery is delivering current to the load 30. Transistors 65, 66, and 67, coupling capacitors 68 and 69, storage capacitor 70, inductance 71, and resistors 72, 73, and 74 comprise a regulated oscillator step up power supply 61. This portion of circuit 28 is a variation of a standard multivibrator, with the inductance 71 replacing a resistor normally found in the collector leg of transistor 66. A square wave frequency determined by appropriate selection of values for resistors 72, 73, and 74, capacitors 68 and 69, and inductance 71 is generated at the collectors of transistors 65 and 66. When transistor 66 is shut off during each alternate cycle, the magnetic field in inductance 71 collapses, creating a flyback high voltage spike at the collector of transistor 66 which is directed to storage capacitor 70 through transistor 67.

Transistor 67 has two functions. The first is to act as a blocking diode to allow capacitor 70 to charge up to a constant high voltage. The second function is to act as a voltage regulator as a result of the transistor Zener diode effect The junction 76 between the emitter of transistor 75 and storage capacitor 70 becomes a source of regulated voltage which is connected to the first terminal 50 of resistor 49 of the indicating display unit, with the other side of the storage capacitor 70 being connected to the second terminal 51 of resistor 49. The level of the thus regulated reference voltage is determined by selecting the transistor 67 for a desired Zener diode voltage and is usually much higher than the input voltage presented at resistor 72.

The regulated reference voltage is also fed to the amplifier section 62, which is composed of resistor 77, resistor 78, and transistor 79. The output of the amplifier is applied to the address terminal 46 of the liquid crystal display unit. The amplification factor of the amplifier section 62 is selected to create a cursor type bar graph display on the liquid crystal unit, similar to that of the high voltage example of FIG. 8, indicative of the input voltage developed at resistor 64 and applied to the base of transistor 79.

The regulated step up power supply section 61 provides a relatively high voltage with minimal current drain. The high impedance analog liquid crystal display 21 operates well with very low currents. The display will operate in the D.C. mode without any appreciable plating within the display due to the very low current passing through the liquid crystal and also because the display is actuated only when the load is applied to the battery.

The circuit of FIG. 10 drives a single channel display unit 21 to indicate the charge level of the battery 29. There can be situations when the charge level will change rapidly, and if the display is not observed continuously, an incorrect interpretation could result. A variation of the circuit and display of FIG. 10 provides a means to display the rate of discharge as well as the charge (or discharge) level.

Figure 11:
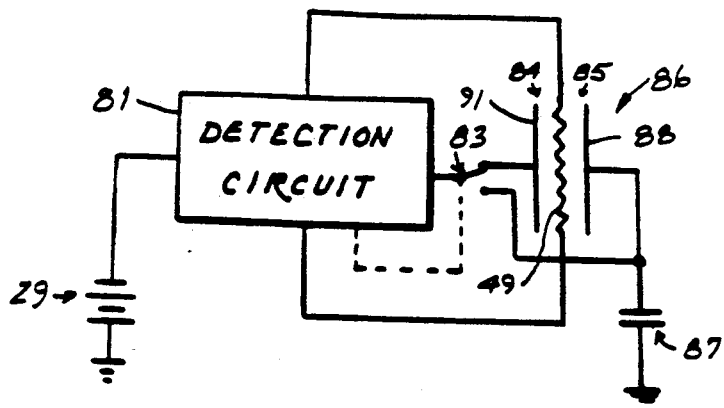
FIG. 11 is a block diagram of an alternative embodiment of the invention employing a dual liquid crystal unit for indicating both the state of charge and the rate of change of the state of charge of a battery.

In the block diagram of FIG. 11, detection circuit 81, which corresponds to circuit 28 of FIG. 10, has an output connected to the common terminal of a switch 83. The switch can connect to either channel 84 or channel 85 of a two channel analog display unit 86. The rate at which switch 83 shifts between channels is determined by components in the detection circuit 81. A storage capacitor 87 is connected to the address electrode 88 of channel 85 to provide an inexpensive sample and hold circuit.

The detection circuit senses the voltage level of the rechargeable battery 29 as described previously. The output is now directed alternately to the two channels of display unit 86 through the switch 83 at time intervals sufficient to show separate voltages if the levels have changed during the interval. It is necessary to store at least one of the samples in the storage capacitor 87 in order to view onetime period in memory.

If the battery 29 has been fully charged, the rate at which the voltage drops is very slow, producing an insignificant difference in two successive measurements separated by the preselected fixed time interval. The two channel display unit will have two bar graphs 89 and 90 (see FIGS. 12A-C) side by side, and as shown in FIG. 12A, the bars will appear to be at almost the same level, with the second bar 90 representing the stored voltage level applied to address electrode 88 of the second channel 85 and the first bar 89 representing the current instantaneous level as applied to address electrode 91 of the first channel 84.

When the dual bar graphs 89 and 90 are nearly at equal levels the charge level of the battery is stable. If the battery is not fully charged, the rate at which the voltage drops under load is somewhat faster, producing a more significant difference in two successive measurements separated by the fixed time interval. FIG. 12B shows the dual bar graph display in this situation. The bars now appear at different levels, with the most recent voltage shown on bar 89 significantly lower than the stored voltage level on bar 90. When the dual bar graphs are separated by a significant difference as in FIG. 12B, it is an indication that the overall reading of capacity is changing and should be observed more frequently.

Figure 12A:
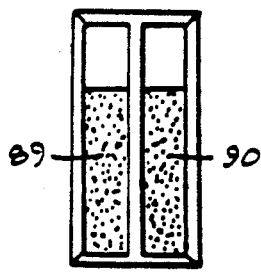
FIGS. 12A, B and C show three different display indications of the dual liquid crystal unit of FIG. 11 for three different conditions of charge, respectively.
Figure 12B:
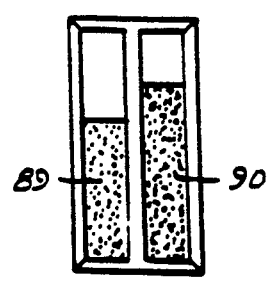
Figure 12C:
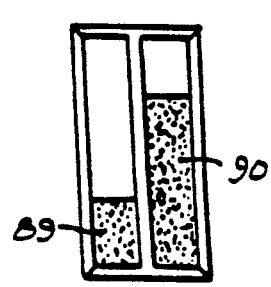

It the battery has had only a brief recharge, then the rate at which the voltage drops is extremely fast, producing a major difference between two measurements that are separated by the fixed time interval and resulting in a reading as shown in FIG. 12C. This is an indication that the overall reading is changing rapidly and only a small surface charge exists in the battery.

The display shown in FIGS. 12A-C includes only two channels 84 and 85 and one storage capacitor 87, but additional channels with additional storage capacitors can be incorporated. The positions of bar graphs 89 and 90 can be reversed, as well, so that the left hand bar denotes the stored value and the right hand bar denotes the current voltage level.

What is claimed is:

1. A device for indicating the state of charge of a battery of an electrical apparatus powered by the battery as determined by a predetermined range of values of variable voltage of the battery in response to the state of charge thereof comprising:
   an amplifying circuit having an input and an output;
   means for connecting the input of the amplifying circuit to the battery when the battery is supplying power to the electrical apparatus, the amplifying circuit including means for producing an output voltage at the output which has a predetermined characteristic for the range of values of the variable battery voltage which is a direct function of the state of charge of the battery;
   means connected to the input of the amplifying circuit for providing a fixed regulated reference voltage from the predetermined range of values of variable voltage of the battery when the input of the amplifying circuit is connected to the battery; and
   an analog solid state display element having first and second terminals, the first terminal being connected to the regulated reference voltage, the second terminal being connected to the output of the amplifying circuit, the display unit producing a visual analog indication of the output voltage of the amplifying circuit applied to the second terminal when the reference voltage is applied to the first terminal.

2. An indicating device in accordance with claim 1 in which the means for producing an output voltage produces a linear function of the variable voltage of the battery.

3. An indicating device in accordance with claim 1 in which the analog solid state display element comprises a pair of first and second plates connected to the first and second terminals respectively and spaced apart from one another to form a gap therebetween, and a field effect visual display material disposed in the gap, the reference voltage connected to the first terminal causing an electric field having a predetermined gradient in a direction parallel to the first plate.

4. An indicating device in accordance with claim 3 in which the display element is an elongated rectangle and in which the predetermined gradient extends in the direction of the long axis of the elongated rectangular display element, such that a change in the optical characteristic of the field effect visual display material produces an optical presentation of the battery voltage in the direction of the elongated axis of the display element.

5. An indicating device in accordance with claim 4 in which the width of a short axis of the elongated rectangle is a minor fraction of the length of the long axis of the elongated rectangle, such that the change in the optical characteristic of the field effect visual display material provides an optical presentation in the form of a bar having a width dimension that extends in the direction of the elongated axis of the display element.

6. An indicating device in accordance with claim 3 in which the means for applying the reference voltage as an electric field having a predetermined gradient applies the reference voltage as a linear gradient.

7. An indicating device in accordance with claim 3 in which the means for applying the reference voltage as an electric field having a predetermined gradient applies the reference voltage as a linear gradient.

8. An indicating device in accordance with claim 1 in which the means connected to the battery for providing a fixed regulated reference voltage from the variable voltage of the battery comprises:
   means for converting the battery voltage into a plurality of pulses,
   means for shaping the plurality of pulses into high voltage short duration pulses,
   means for clipping the high voltage short duration pulses to constant intermediate voltage pulses, and
   means for filtering the constant intermediate voltage pulses to produce the regulated voltage.

9. An indicating device in accordance with claim 8 in which the means for converting the battery voltage into a plurality of pulses comprises a multivibrator circuit having an input connected to the battery and an output for delivering the plurality of pulses, and
   in which the means for shaping the plurality of pulses into high voltage short duration pulses comprises an inductor for producing a high voltage short duration pulses.

10. An indicating device in accordance with claim 1 and further comprising indicia disposed adjacent the display element for indicating the magnitude of the battery voltage displayed by the optical presentation caused by a change in the optical characteristic of the liquid crystal material.

11. An indicating device in accordance with claim 1 in which the analog solid state display element provides an analog bar graph presentation.

12. An indicating device in accordance with claim 1 in which the analog solid state display element is a liquid crystal display element.

13. An indicating device in accordance with claim 3 in which an absence of a voltage applied across the gap between the first and second plates causes the display of the solid state display element to be clear and in which a voltage between the first and second plates greater than an actuating potential of the field effect visual display material causes the display of the solid state display to be dark, such that the resulting display shows a clear bar at a location in the display corresponding to the voltage at the second terminal.

14. An indicating device in accordance with claim 13 in which the width of the bar is a function of the reference voltage applied to the first terminal.

15. A device for indicating the state of charge of a battery of an electrical apparatus powered by the battery comprising:
   a solid state display element having a load electrode, a pair of address electrodes each spaced apart from a different opposite side of the load electrode to form gaps adjacent each of the opposite sides of the load electrode, and a liquid crystal material disposed in the gaps, at least one of the address electrodes being substantially transparent;
   an amplifying circuit having an input and an output;
   means for connecting the input of the amplifying circuit to the battery when the battery is supplying power to the electrical apparatus, the amplifying circuit including means for producing an output voltage at the output which has a predetermined characteristic for the range of values of the variable battery voltage which is a direct function of the state of charge of the battery;

means for alternately connecting each of the address electrodes to the output of the amplifying circuit for applying the output voltage alternately to a different one of the gaps;

means connected to the battery for providing a fixed regulated reference voltage from the variable voltage of the battery corresponding to the state of charge thereof;

means connecting the reference voltage to the load electrode for applying the reference voltage as an electric field having a predetermined gradient;

means for storing the output voltage applied to one of the address electrodes to provide a display of a time average of the magnitude of the output voltage such that the output voltage applied to the other of the address electrodes provides a display of the current state of charge of the battery, and a visual comparison of the displays of both address electrodes provides an optical presentation of the rate of change of the state of charge of the battery.

16. An indicating device in accordance with claim 15 in which the load electrode for applying the reference voltage as an electric field having a predetermined gradient comprises a plurality of parallel conductive strips disposed on a surface facing each of the address electrodes and means connected to the plurality of parallel strips and in conjunction therewith for distributing the reference voltage with respect to each of the plurality of strips as a function of the predetermined gradient of the electric field.

17. An indicating device in accordance with claim 16 in which each of the plurality of conductive strips is substantially conductive and in which the means for distributing the reference voltage with respect to each of the plurality of strips as a function of the predetermined gradient comprises an impedance element, each of the plurality of strips being electrically connected in the order of the plurality of strips to different locations along the extent of the impedance element to enable the potential of each of the plurality of strips to be in accordance with the predetermined gradient.

18. An indicating device in accordance with claim 17 in which the voltage of the battery has a predetermined characteristic in response to the state of charge of the battery and further comprising means for modifying the output voltage of the amplifying circuit as a function of the predetermined characteristic.

19. An indicating device in accordance with claim 18 in which the modifying means provides an output voltage that is a linear function of the voltage of the battery.

20. An indicating device in accordance with claim 17 in which the impedance element comprises a resistive element.

21. An indicating device in accordance with claim 20 in which the resistive element extends substantially adjacent a corresponding end portion of each of the plurality of conductive strips, the end portion of each of the conductive strips being electrically connected in the order of the plurality of strips to different locations disposed along the length of the resistive element.

22. An indicating device in accordance with claim 15 in which the means for storing the output voltage applied to one of the address electrodes comprises a capacitor connected to said one of the address electrodes.

23. A method for providing an optical presentation of the state of charge of a battery of an electrical apparatus powered by the battery on a liquid crystal display element having a pair of plates spaced apart from one another to form a gap therebetween and a liquid crystal material disposed in the gap, at least one of the plates being substantially transparent, the battery voltage to be applied being at a pair of battery terminals, the method comprising the steps of:

generating a reference voltage of predetermined fixed value from the battery voltage as it appears across the pair of battery terminals;

applying the fixed reference voltage to one of the plates as an electric field having a predetermined gradient;

generating an address voltage from the battery voltage as it appears across the pair of battery terminals, the address voltage having a value that is a predetermined function of the battery voltage and that is always less than the value of the reference voltage; and applying the address voltage which is a function of a voltage of the battery to the other of the plates as a substantially uniform electric field causing the liquid crystal material to provide an optical presentation of the magnitude of the battery voltage or the state of charge of the battery.

24. A method in accordance with claim 23 in which the liquid crystal display element has a plurality of parallel conductive strips disposed on the surface of the one plate facing the gap and in which the step of applying the reference voltage to the one plate as an electric field having a predetermined gradient comprises distributing the value of the reference voltage with respect to each of the plurality of strips as a function of the predetermined gradient of the reference voltage to be applied to the one plate.

25. A method in accordance with claim 23 in which the step of applying the reference voltage to the one plate as an electric field having a predetermined gradient comprises applying the reference voltage to the one plate as an electric field having a linear gradient.

26. A method in accordance with claim 23 in which the step of applying the reference voltage to the one plate as an electric field having a predetermined gradient comprises applying the reference voltage to the one plate as an electric field having a gradient which is a function of the relation between the battery voltage and the state of charge of the battery.

27. A method in accordance with claim 23 in which the resultant of the electric field of a predetermined gradient and the substantially uniform electric field causes a change in the optical characteristic of the liquid crystal material which provides an optical presentation of the battery voltage or the state of charge of the battery when the battery voltage is above a predetermined minimum level.

28. A method in accordance with claim 23 in which the step of applying the reference voltage to the one plate as an electric field having a predetermined gradient is conditioned to cause the electric field throughout the predetermined gradient thereof to be above a predetermined minimum level corresponding to one of a maximum level and a minimum level of the battery voltage and to be below a predetermined maximum level for the other of the maximum and minimum levels of the battery voltage.

29. A method of indicating the state of charge of a battery of an electrical apparatus powered by the battery on a solid state display element having a load electrode, a pair of address electrodes each spaced apart from a different opposite side of the load electrode to form gaps adjacent each of the opposite sides of the load electrode, and a liquid crystal material disposed in the gaps, at least one of the address electrodes and the load electrode being substantially transparent, the method comprising the steps of:

generating an address voltage from the battery voltage, the address voltage being a predetermined function of the battery voltage;

alternately applying the address voltage to one and the other of the address electrodes as a substantially uniform electric field;

storing the value of address voltage alternately applied to the other of the address electrodes to provide a time-averaged value;

generating a reference voltage from the battery voltage, the reference voltage having a preselected fixed value that is greater than any value of the address voltage; and applying the reference voltage to the load electrode as an electric field having a predetermined gradient such that the resultant of the electric field of predetermined gradient and the substantially uniform electric field applied to the one address electrode causes the liquid crystal material to provide a display of the magnitude of the battery voltage and of the state of charge of the battery, and the resultant of the electric field of predetermined gradient and the substantially uniform field applied to the other address plate produces a display of time-averaged value of the state of charge of the battery, thereby providing in conjunction with the first-mentioned display an optical presentation of the rate of change of the magnitude of the battery voltage or the state of charge of the battery.

30. A method in accordance with claim 29 in which the resultant of the electric field of a predetermined gradient and the substantially uniform electric field applied to the one address electrode when above a predetermined level of battery voltage causes a change in the characteristic of the solid state display element which provides an optical presentation of the battery voltage and the state of charge of the battery.

* * * * *